United States Patent
Trotta et al.

(10) Patent No.: US 9,866,222 B2
(45) Date of Patent: Jan. 9, 2018

(54) SYSTEM AND METHOD FOR SYNCHRONIZING MULTIPLE OSCILLATORS USING REDUCED FREQUENCY SIGNALING

(71) Applicant: Infineon Technologies AG, Neubiberg (DE)

(72) Inventors: Saverio Trotta, Munich (DE); Reinhard-Wolfgang Jungmaier, Vaterstetten (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 325 days.

(21) Appl. No.: 14/597,039

(22) Filed: Jan. 14, 2015

(65) Prior Publication Data

US 2016/0204784 A1 Jul. 14, 2016

(51) Int. Cl.
| | | |
|---|---|---|
| H03L 7/00 | (2006.01) |
| H03L 7/07 | (2006.01) |
| H01Q 3/30 | (2006.01) |
| H03L 7/093 | (2006.01) |
| H03L 7/099 | (2006.01) |

(52) U.S. Cl.
CPC .............. *H03L 7/07* (2013.01); *H01Q 3/30* (2013.01); *H03L 7/093* (2013.01); *H03L 7/099* (2013.01)

(58) Field of Classification Search
CPC ... H03L 7/24; H03L 7/07; H03L 7/099; H03L 7/093; H01Q 3/30
USPC ......... 370/342; 331/2, 55, 46; 342/361, 358, 342/356, 103, 100
See application file for complete search history.

(56) References Cited

U.S. PATENT DOCUMENTS

| | | | |
|---|---|---|---|
| 5,124,569 A | * | 6/1992 | Phillips ................ H03K 5/1506 327/150 |
| 7,109,803 B2 | | 9/2006 | Rebel |
| 2002/0061004 A1 | | 5/2002 | Lomp et al. |
| 2007/0205836 A1 | | 9/2007 | Xu |
| 2009/0066436 A1 | | 3/2009 | Wang et al. |
| 2013/0271229 A1 | | 10/2013 | Gao et al. |

FOREIGN PATENT DOCUMENTS

| | | |
|---|---|---|
| DE | 102007030944 A1 | 1/2009 |
| KR | 1020060029136 A | 4/2006 |

* cited by examiner

*Primary Examiner* — Arnold Kinkead
(74) *Attorney, Agent, or Firm* — Slater Matsil, LLP (57) ABSTRACT

An embodiment method for voltage-controlled oscillator (VCO) control includes detecting a first VCO output signal of a first VCO. The first VCO output signal has a first VCO output frequency. The method also includes determining a first down-scaled signal in accordance with the first VCO output signal. The first down-scaled signal has a first down-scaled frequency that is reduced by a fixed ratio relative to a current value of the first VCO output frequency. The method also includes modifying the first VCO output frequency using a first phase lock loop (PLL) in accordance with the first down-scaled signal and an oscillating reference signal, and detecting a second VCO output signal of a second VCO. The second VCO output signal has a second VCO output frequency. The method also includes modifying the second VCO output frequency in accordance with the second VCO output signal and the first down-scaled signal.

24 Claims, 7 Drawing Sheets

SYSTEM AND METHOD FOR SYNCHRONIZING MULTIPLE OSCILLATORS USING REDUCED FREQUENCY SIGNALING

TECHNICAL FIELD

The present invention relates generally to a system and method for oscillator control, and, in particular embodiments, to a system and method for synchronizing multiple oscillators using reduced frequency signaling.

BACKGROUND

Radio-frequency (RF) transmitters and receivers having multiple high frequency channels that are frequency-locked or jointly modulated are useful for a variety of applications. These applications include remote sensing, radar, and airport security screening systems. High-speed data links, high-speed wireless local area networks, and broadband Internet access systems also can benefit from high frequency multi-channel RF implementations.

Nevertheless, designing such multiple interlocked RF channels presents a number of challenges. RF transmitter and receiver systems are typically implemented on Printed Circuit Board (PCB), and the antennas of many systems are implemented using traces directly on the underlying PCB. Yet in some applications these PCB antenna designs limit scalability and flexibility and make increasing or decreasing the number of channels more difficult. Furthermore, for a given PCB material, energy losses increase with increasing channel frequency and trace length. Regardless of antenna design, such increasing energy losses would be experienced if a single Local Oscillator (LO) operating at high radio frequencies were to be shared between separate channels to provide the mechanism of frequency-locking or jointly modulating the channels.

SUMMARY OF THE INVENTION

In accordance with an embodiment of the present invention, a method for voltage-controlled oscillator (VCO) control is provided. The method includes detecting a first VCO output signal of a first VCO. The first VCO output signal has a first VCO output frequency. The method also includes determining a first down-scaled signal in accordance with the first VCO output signal. The first down-scaled signal has a first down-scaled frequency that is reduced by a fixed ratio relative to a current value of the first VCO output frequency. The method also includes modifying the first VCO output frequency using a first phase lock loop (PLL) in accordance with the first down-scaled signal and an oscillating reference signal, and detecting a second VCO output signal of a second VCO. The second VCO output signal has a second VCO output frequency. The method also includes modifying the second VCO output frequency in accordance with the second VCO output signal and the first down-scaled signal.

In accordance with another embodiment of the present invention, a system for VCO control is provided. The system includes a first VCO having a first control signal and a first VCO output signal. The first VCO output signal has a first VCO output frequency. The first VCO is configured to modify the first VCO output frequency when the first control signal is modified. The system also includes a second VCO having a second control signal and a second VCO output signal. The second VCO output signal has a second VCO output frequency. The second VCO is configured to modify the second VCO output frequency when the second control signal is modified. The system also includes a second control circuit coupled to the second VCO. The second control circuit is configured to modify the second control signal in accordance with a first down-scaled signal. The system also includes a first control circuit coupled to the first VCO and to the second control circuit. The first control circuit includes a first frequency down-scaling circuit and a first PLL circuit. The first frequency down-scaling circuit includes at least one of a frequency mixer and a frequency divider and is configured to determine the first down-scaled signal in accordance with the first VCO output signal. The first down-scaled signal has a first down-scaled frequency that is reduced by a fixed ratio relative to a current value of the first VCO output frequency. The first PLL circuit is configured to modify the first control signal in accordance with the first down-scaled signal.

In accordance with another embodiment of the present invention, a phased array beamforming system is provided. The system includes a master satellite, which is an RF front end that includes a master VCO. The system also includes at least one slave satellite, which is an RF front end that includes a slave VCO. The system further includes a master PLL circuit coupled to the master satellite and configured to control an output frequency of the master VCO. The system additionally includes a respective slave PLL circuit coupled to at least one slave satellite and configured to control an output frequency of the slave VCO in accordance with a phase-delayed master VCO reference signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for synchronizing multiple oscillators for use in an RF transceiver system such as an FMCW radar system or a phased array beamforming system. Further embodiments may be applied to other RF transmitter/receiver systems that require reduced frequency signaling to synchronize multiple oscillators for use in, for example, remote sensing, airport security screening, high-speed data links, high-speed wireless local area networks, and broadband Internet access systems.

Figure 1:
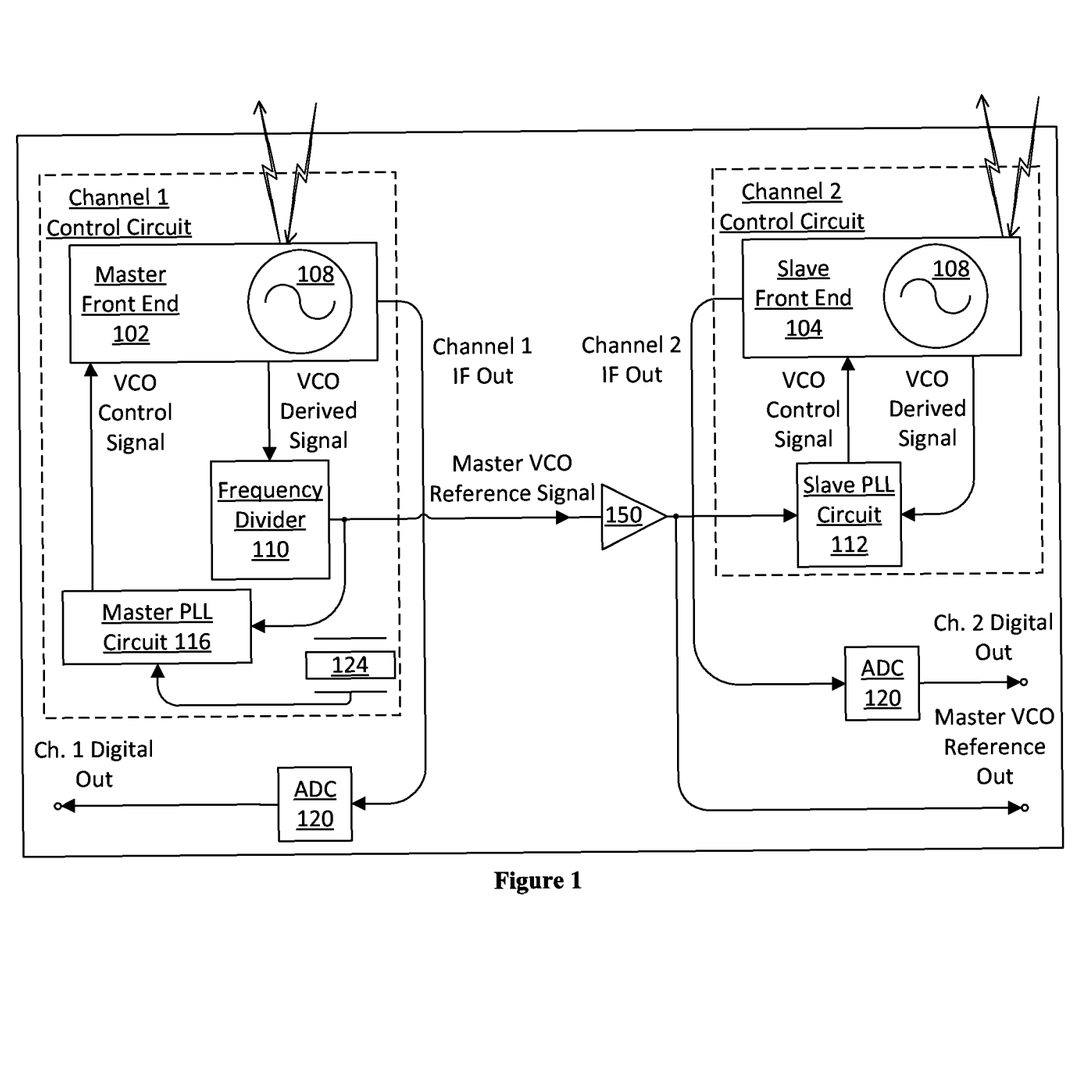
FIG. 1 shows an RF transceiver system that includes multiple front-ends that have a relatively high frequency yet are interlocked by a reference signal that has a relatively low frequency in accordance with embodiments of the present invention.

FIG. 1 shows an embodiment RF transceiver system that includes multiple front-ends 102 and 104 having a relatively high transmit/receive frequency (e.g., above 10 Gigahertz (GHz)). The system uses front ends 102 and 104 that are interlocked by a reference signal that feeds both a master PLL circuit 116 and one or more slave PLL circuits 112. Each of the front ends 102 and 104 is an RF transceiver that uses a VCO 108 or other Variable Frequency Oscillator (VFO) as the front end's LO. The front ends 102 and 104 coordinate their VCO modulation in a master-slave relationship using a master VCO reference signal that has a relatively low frequency (e.g., below 1 GHz). One front end 102 is a master front end that is included in a control circuit for a first transmit/receive channel and the other front end 104 is a slave front end that is included in a control circuit for a second transmit/receive channel. In an embodiment, multiple slave front ends are present and coordinate their modulation in multiple slave channels using the master VCO reference signal.

Each front end 102 and 104 is an Antenna-In-Package (AIP) satellite chip configured to transmit a respective outgoing RF signal and receive a respective incoming RF signal at one or more internal antennas so that the system is suitable for mounting on low-cost, low-frequency PCB such as, for example, FR-4. Other embodiments use external antennas that are implemented using traces directly on PCB material that is capable of supporting higher frequencies.

Referring again to FIG. 1, an incoming RF signal is down-converted to produce a respective Intermediate Frequency (IF) output of each front end 102 and 104. In an embodiment, these IF outputs have a frequency of less than 1 MHz. The IF outputs of the front ends 102 and 104 may be passed to one or more Analog-to-Digital Converters (ADCs) 120. The digital outputs of these ADCs 120 may then be used for baseband operations such as, for example, Discrete Fourier Transform (DFT) processing in radar and wireless networking applications.

Each front end 102 and 104 also generates a VCO-derived output signal having a frequency that can be modified by a VCO control signal. The VCO-derived output of the master front end 102 is down-scaled in frequency by a constant in frequency divider 110 to produce a down-scaled signal that is related to the frequency of the master front end's VCO 102 and that is used as a master VCO reference signal. The master VCO reference signal tracks the frequency and modulation of the VCO output signal of the master front end 102, but the master VCO reference signal is also used as a reference for a slave PLL circuit 112. The slave PLL circuit may include, for example, an integer PLL and a loop filter. The master VCO reference signal is provided to the slave PLL circuit 112 after being amplified by amplifier 150. When the slave PLL circuit 112 is in phase lock, it tunes the frequency of the slave front end's VCO in accordance with the VCO-derived output signal of the master front end 102.

The VCO control signal of the master front end 102 is provided by a master PLL circuit 116. The master PLL circuit 116 receives the master VCO reference signal and tunes the master front end's VCO by generating the VCO control signal in accordance with the output of a reference oscillator 124.

Figure 2A:
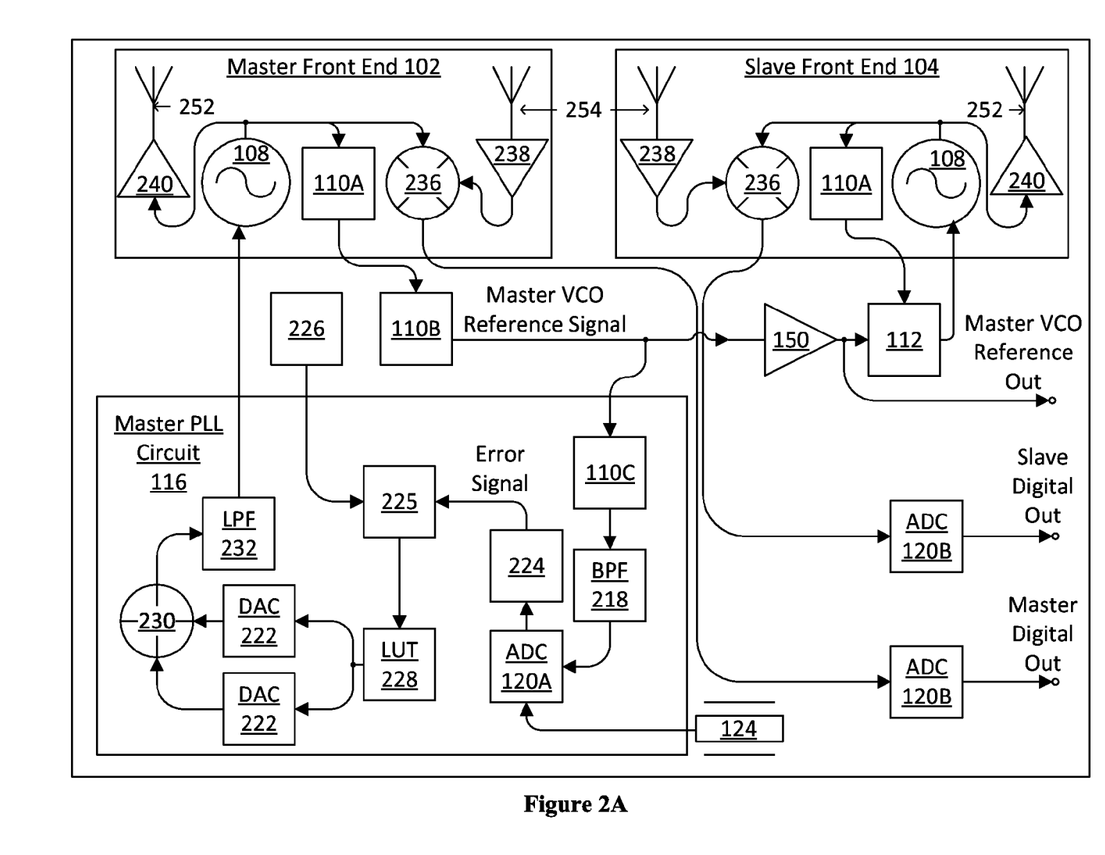
FIGS. 2A and 2B, is a block diagram of a frequency-modulated continuous wave (FMCW) system that includes multiple front-ends in accordance with embodiments of the present invention.
Figure 2B:
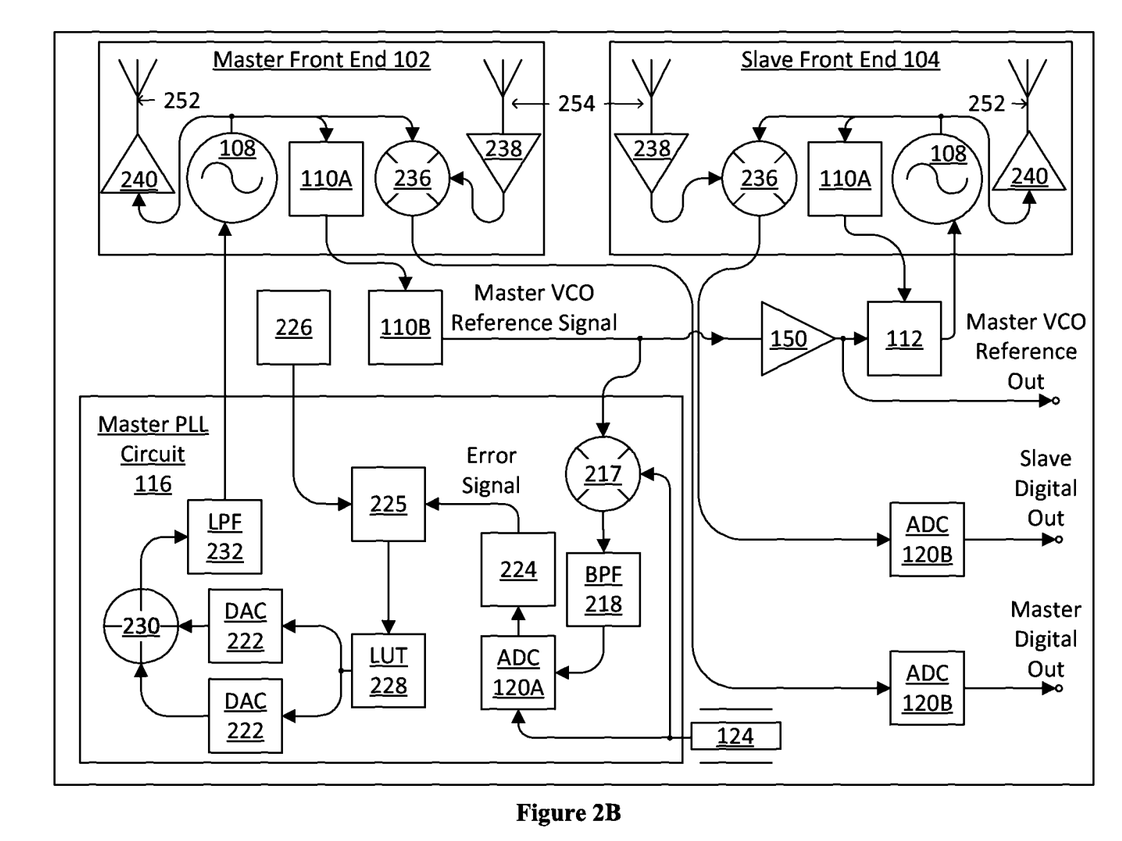

FIG. 2, which includes FIGS. 2A and 2B, shows embodiment FMCW systems that include multiple interlocked front ends 102 and 104. FIG. 2A shows an embodiment using a master PLL circuit that includes a frequency divider circuit 110C. FIG. 2B shows an embodiment using a master PLL circuit that includes a frequency mixer 217 for downmixing. Although the embodiments of FIG. 2 are described in terms of an FMCW application, one of ordinary skill in the art would recognize that other applications may also be implemented using the embodiments of FIG. 2.

Referring now to FIG. 2A, the incoming RF signal of each front end 102 and 104 is received at antenna 254 and is amplified by receive amplifier 238. The amplified receive signal is then mixed with the output signal of the VCO 108 by frequency mixer 236 to produce a respective IF output of each front end 102 and 104. The IF outputs of the front ends 102 and 104 may be digitized in one or more ADCs 120B and then used for baseband operations.

In each front end 102 and 104, the VCO 108 also generates a VCO output signal having a frequency that can be modified by a VCO control signal in accordance with the VCO's tuning characteristic. The VCO output signal can be modulated by modulating the VCO control signal to produce an FMCW. The resulting VCO output signal is amplified by transmit amplifier 240 and transmitted by antenna 252. The output signal of the VCO 108 is also fed to a frequency divider 110A, where the VCO output signal is scaled down in frequency by a first constant and is provided as a respective VCO-derived output of each front end 102 and 104.

The VCO-derived output of the master front end 102 is then down-scaled again by a second constant in frequency divider 110B to produce a second down-scaled signal that is related to the frequency of the master front end's VCO and that is used as the master VCO reference signal. In an embodiment, this master VCO reference signal has a frequency of approximately 30 MHz. As a first example, the master VCO may generate an output signal with an expected frequency of 60 GHz, which may then be frequency down-scaled in frequency divider 110A by a factor of 32 and then down-scaled again in frequency divider 110B by a factor of 64. As another example, the master VCO may generate an output signal with an expected frequency of 80 GHz, which may then be frequency down-scaled in frequency divider 110A by a factor of 42 and then down-scaled again in frequency divider 110B by a factor of 64.

The master VCO reference signal tracks the frequency and modulation of the FMCW-modulated VCO output signal of the master front end 102. When the master VCO reference signal is frequency swept by the master PLL circuit 112 and the slave PLL circuit 112 is in phase lock, then the slave PLL circuit 112 automatically modulates the frequency of the VCO 108 of the slave front end 104 in accordance with the FMCW of the VCO output signal of the master front end 102.

In the embodiment of FIG. 2A, the master PLL circuit 116 is a software PLL that digitally samples the master VCO-derived signal and digitally tunes the master VCO control signal. The resolution of the digital tuning is improved by using multiple parallel Digital-to-Analog-Converters (DACs) 222. In other embodiments, a single DAC is used. In still other embodiments, an analog PLL is used as the master PLL circuit 116.

Referring again to FIG. 2A, in the master PLL circuit 116, the master VCO reference signal is scaled down in frequency again by a third constant in frequency divider 110C and then the output is passed to a Band-Pass Filter (BPF) 218 and then to an ADC 120A. In the embodiment of FIG. 2A, a reference oscillator 124 provides an oscillating reference signal that is used as a reference clock for the ADC 120A. The reference oscillator 124 may include a crystal oscillator or any other stable electronic oscillator. In other embodiments, the oscillating reference signal is provided to the PLL detector 224 instead of the ADC 120A.

The ADC 120A samples the IF output of the BPF 218 in accordance with the reference clock. Under-sampling is used to sample the relatively higher frequency BPF output with a relatively lower frequency ADC 120A. For example, a master VCO reference signal may be a 30 MHz signal that is scaled down in frequency by a factor of four in frequency divider 110C and then band-pass filtered to provide an IF signal that is capable of being under-sampled at 2 MHz by ADC 120A.

Referring again to FIG. 2A, after the ADC 120A samples the output of the BPF 218, it then sends its digital output to a PLL detector 224 that is a phase detector or a phase-frequency detector. The PLL detector 224 outputs an error signal that is either a phase difference or a frequency difference between the VCO-derived signal and the oscillating reference signal. In the embodiment of FIG. 2A, the PLL calculates this error signal using the reference-clocked output of the ADC 120A. In other embodiments, the PLL detector 224 calculates the error signal by comparing the VCO-derived signal that is output from ADC 120A with an output of the reference oscillator 124 that has been band-pass filtered and digitized by an ADC. In still other embodiments, the reference oscillator provides a digital output to the PLL detector.

A tuning calculator 225 monitors the error signal output of the PLL detector 224 to iteratively calculate a tuning signal in accordance with a tuning characteristic of the master VCO. This tuning signal may, for example, include tuning words determined by a digital control law for each digital error signal within the system operating range. These tuning words point to one or more values stored in one or more Look-Up Tables (LUTs) 228, which are then provided as input to one or more DACs 222. The tuning words are calculated to modify the master VCO output to minimize the error signal from the PLL detector 224. In the embodiment of FIG. 2A, a PLL modulator 226 that is external to the master PLL circuit 116 provides an offset signal into the digital control law that adjusts the digital tuning word so that the master VCO control signal is modulated in accordance with a desired master VCO modulation. In other embodiments, the master VCO control signal is not modulated, but instead an IF input is provided to the master front end 102 to modulate the transmitted signal.

In an embodiment, the PLL modulator 226 is an offset value generator that determines components to be added to the digital tuning matrix to provide a linear FMCW control signal as the master VCO control signal. These modulation components are provided to the tuning calculator 225 that points to DAC input values stored in LUT 228. In other embodiments, no PLL modulator 226 is present and the tuning word is calculated by the tuning calculator 225 without modification.

Each of the DACs 222 then generates a respective analog control signal. In an embodiment, one of the DACs 222 generates a coarse control signal and the other generates a fine control signal. These multiple analog control signals are smoothed and integrated by a Low-Pass Filter (LPF) 232 to provide a single continuous control signal that modulates the master front end's VCO.

Referring now to FIG. 2B, an alternative embodiment of the multiple front end system of FIG. 2A is shown. The difference between this embodiment and the embodiment of FIG. 2A is that the frequency divider 110C of the master PLL circuit 116 has been replaced by a frequency mixer 217. This frequency mixer 217 mixes the master VCO reference signal and the output of the reference oscillator 124. The frequency mixer 217 provides a mixed output signal to the BPF 218. The BPF 218 outputs a filtered signal that has a frequency that is lower than that of the master VCO reference signal, but which still tracks the master VCO frequency to support digital tuning of the master VCO to provide an FMCW.

Figure 3:
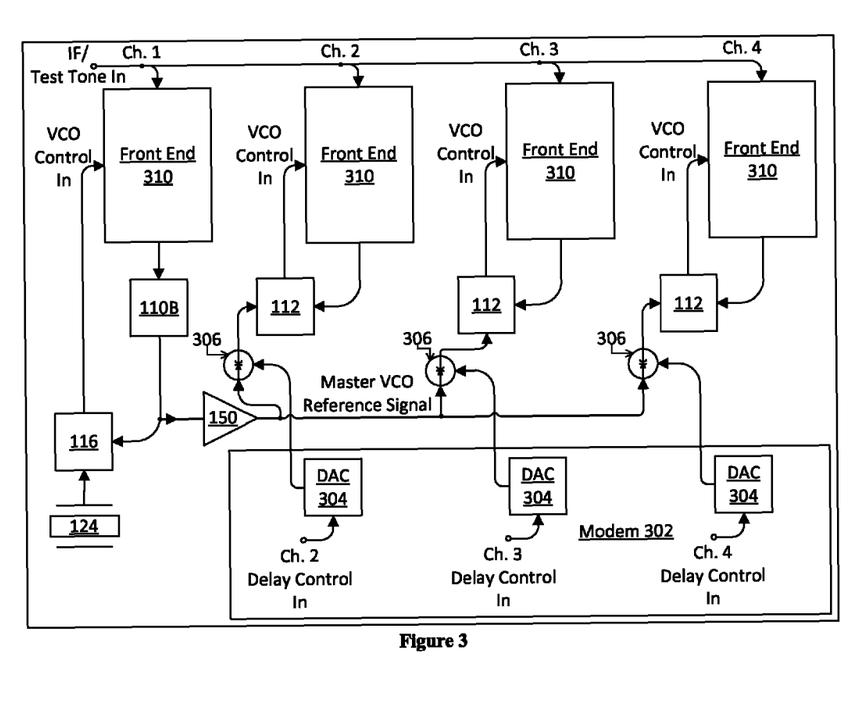
FIG. 3 is a block diagram of a system for an analog beam-steering phased array in accordance with embodiments of the present invention.

Referring now to FIG. 3, an embodiment system for an analog beam-steering phased array is shown. The system adds phase delay to a master VCO reference signal to provide a different phase for one or more slave front ends. Four front ends 310 are illustrated as an example, although the number of front ends may be greater or fewer. Each of these front ends 310 is an AIP system having one or more internal antennas for transmitting and receiving over an RF channel. During transmission, each front end 310 modulates a similar IF signal onto a respective VCO output signal (i.e., a carrier signal) that is phase and frequency controlled using a respective PLL. Channel 1 is a master channel that is controlled using a master PLL circuit 116 in accordance with a reference oscillator 124. A frequency divider 110B receives the master VCO output from the channel 1 front end and provides a master VCO reference signal to slave channels 2 to 4. The VCO output signal of each of these slave channels has a respective phase shift applied relative to the VCO of the master channel and is controlled using a respective slave PLL circuit 112.

In an embodiment, the phase of each slave channel has between five and ten degrees of accuracy and is within plus-or-minus 90 degrees from the phase of the master channel. The respective phase shift of each slave channel determines the beam axis of the phased array radiation pattern that is made up of the collective signals transmitted from the front ends 310. The phase shift for each slave channel is provided by a respective delay circuit 306 that includes, for example, a varactor diode. Each delay circuit 306 is tuned with a respective DAC 304 to add a delay to the master VCO reference signal. Each DAC 304 is included in a modem 302 that receives a respective tuning word from an external processor at a delay control input.

To tune the system, a phase delay is applied recursively to each slave channel until the difference between the output phase of a slave channel and a known output phase of another channel (the master channel or a previously tuned slave channel) matches a desired phase difference. Multiple factors such as PCB layout, temperature, and variation between components will result in differing propagation delays to the output of each front end 310. As a result, it is desirable to measure the initial phase difference between the front ends 310 before any phase delay is added to the system and to store this initial information as a calibration offset. The tuning word provided to each of the DACs 304 may then be reduced by this calibration offset, which is received from the external processor by the modem 302.

Figure 4:
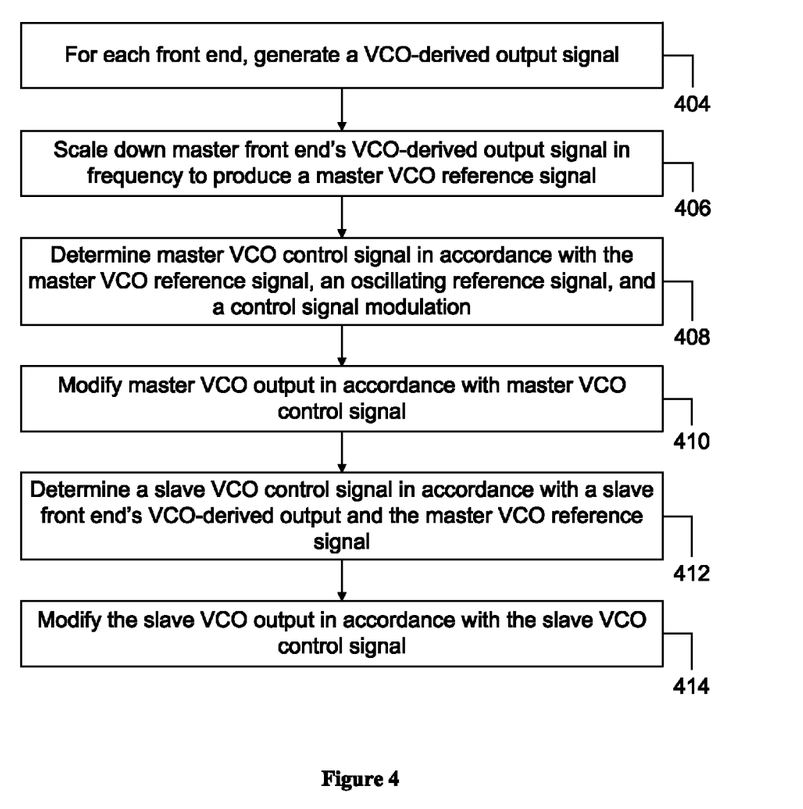
FIG. 4 is a flow diagram illustrating a method for controlling Voltage-Controlled Oscillators (VCOs) in a multiple front-end system in accordance with embodiments of the present invention.

Referring now to FIG. 4, an embodiment method for controlling VCOs in a multiple front-end system is illustrated. At 404, the VCO of each front end generates a respective output signal. The VCO output signal is then amplified and is scaled down in frequency by a first constant. The down-scaled signal is provided as a respective VCO-derived output of each front end. At 406, the VCO-derived output of the master front end is then down-scaled again by a second constant to produce a second down-scaled signal. This second down-scaled signal is related to the master VCO output frequency and is used as a master VCO reference signal. At 408, a master PLL circuit determines a master VCO control signal in accordance with the master VCO reference signal, an oscillating reference signal, and optionally a control signal modulation such as, for example, an FMCW. At 410, the VCO output of the master front end is modified in accordance with the master VCO control signal. At 412, a slave PLL circuit determines a slave VCO control signal in accordance with the VCO-derived output of the slave front end and the master VCO reference signal. At 414, the slave VCO output is modified in accordance with the slave VCO control signal.

Figure 5:
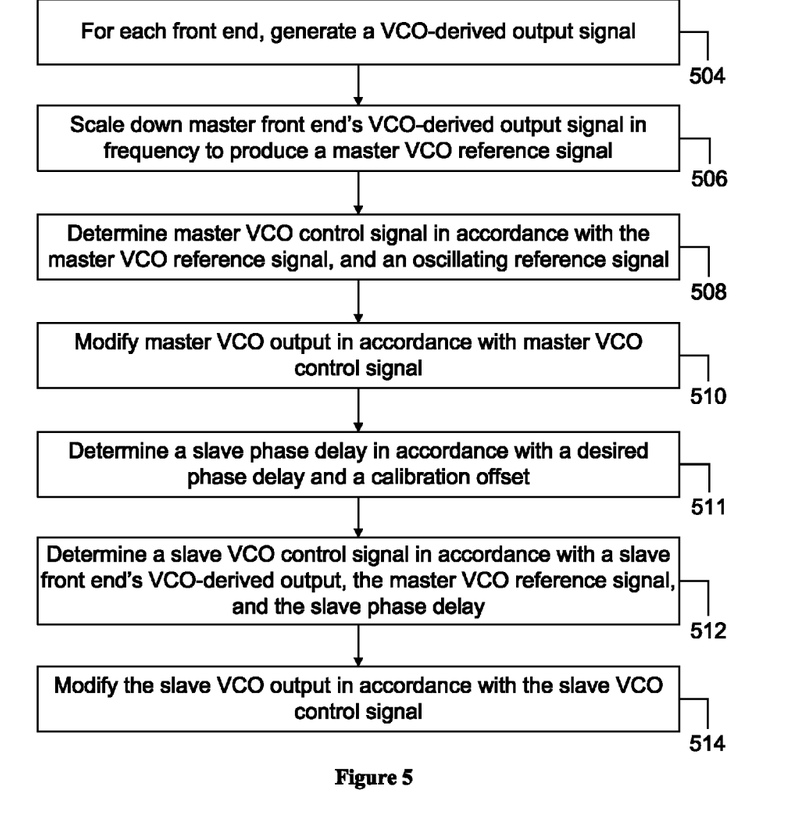
FIG. 5 is a flow diagram illustrating a method for controlling VCOs in a multiple front-end system in which a phase delay is added to a slave channel in accordance with embodiments of the present invention.

FIG. 5 illustrates an alternative embodiment method for controlling VCOs in a multiple front-end system in which a phase delay is added to a slave channel. At 504, the VCO of each front end generates a respective output signal that is then amplified. The amplified VCO output signal is then scaled down in frequency by a first constant and is provided as a respective VCO-derived output of each front end. At 506, the VCO-derived output of the master front end is then down-scaled again in frequency by a second constant to produce a second down-scaled signal. This second down-scaled signal has a frequency that is related to the master VCO output frequency and is used as a master VCO reference signal. At 508, a master PLL circuit determines a master VCO control signal in accordance with the master VCO reference signal and an oscillating reference signal. At 510, the VCO output of the master front end is modified in accordance with the master VCO control signal. At 511, a slave channel's phase delay is determined in accordance with a desired phase delay for the slave channel and in accordance with a calibration offset. At 512, a slave VCO control signal is determined in accordance with the VCO-derived output of the slave front end, the master VCO reference signal, and the slave phase delay. At 514, the slave VCO output is modified in accordance with the slave VCO control signal.

Figure 6:
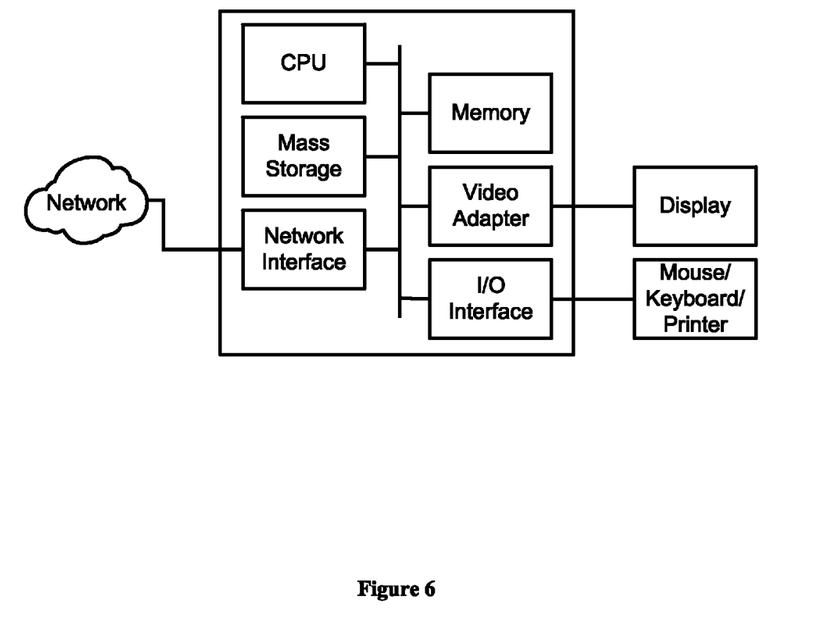
FIG. 6 is a block diagram of a processing system that may be used for implementing some of the devices and methods disclosed herein in accordance with embodiments of the present invention.

FIG. 6 shows a block diagram of a processing system that may be used for implementing some of the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. In an embodiment, the processing system comprises a computer workstation. The processing system may comprise a processing unit equipped with one or more input/output devices, such as a speaker, microphone, mouse, touchscreen, keypad, keyboard, printer, display, and the like. The processing unit may include a CPU, memory, a mass storage device, a video adapter, and an I/O interface connected to a bus. In an embodiment, multiple processing units in a single processing system or in multiple processing systems may form a distributed processing pool or distributed editing pool.

The bus may be one or more of any type of several bus architectures including a memory bus or memory controller, a peripheral bus, video bus, or the like. The CPU may comprise any type of electronic data processor. The memory may comprise any type of system memory such as random access memory (RAM), static RAM (SRAM), dynamic RAM (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

The video adapter and the I/O interface provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces, which may comprise wired links, such as an Ethernet cable or the like, and/or wireless links to access nodes or different networks. The network interface allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like. The network interface may be configured to have various connection-specific virtual or physical ports communicatively coupled to one or more of these remote devices.

Illustrative embodiments of the present invention have the advantage of providing multiple RF transceiver channels using multiple front-ends that coordinate for frequency locking or joint modulation despite constraints that prevent sharing an LO between the front ends. An embodiment system may use, for example, AIP satellite microchips for the front ends so that expensive PCB is not required for PCB-implemented antennas. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for voltage-controlled oscillator (VCO) control, the method comprising:
   detecting a first VCO output signal of a first VCO comprised in a first control circuit, wherein the first VCO output signal has a first VCO output frequency;
   determining a first down-scaled signal in accordance with the first VCO output signal, wherein the first down-scaled signal has a first down-scaled frequency that is reduced by a fixed ratio relative to a current value of the first VCO output frequency;

modifying the first VCO output frequency using a first phase lock loop (PLL) in accordance with the first down-scaled signal and an oscillating reference signal;

transmitting the first down-scaled signal over a length of printed circuit board (PCB) from the first control circuit to a second control circuit;

detecting a second VCO output signal of a second VCO comprised in the second control circuit, wherein the second VCO output signal has a second VCO output frequency; and modifying the second VCO output frequency in accordance with the second VCO output signal and the first down-scaled signal, wherein modifying the second VCO output frequency comprises determining a second down-scaled signal in accordance with the second VCO output signal, wherein the second down-scaled signal has a frequency that is reduced by a fixed ratio relative to the current value of the second VCO output frequency; and modifying the second VCO output frequency using a second PLL in accordance with the second down-scaled signal and the first down-scaled signal.

2. The method of claim 1, wherein the modifying the first VCO output frequency using the first PLL comprises:
   detecting an oscillating reference signal;
   determining a first error signal in accordance with the oscillating reference signal and the first down-scaled signal, the first error signal comprising at least one of a phase difference and a frequency difference; and
   modifying the first VCO output frequency in accordance with the first error signal.

3. The method of claim 2, wherein the determining the first error signal comprises:
   determining a third down-scaled signal having a frequency that is reduced by a fixed ratio relative to a current value of the first down-scaled frequency;
   band-pass filtering the third down-scaled signal to obtain a band-pass filtered signal;
   digitally sampling the band-pass filtered signal in accordance with the oscillating reference signal to obtain a digital down-scaled signal; and
   determining the first error signal in accordance with the digital down-scaled signal.

4. The method of claim 2, further comprising calculating a tuning signal for a frequency-modulated continuous wave; and
   wherein the determining the first error signal is further in accordance with the tuning signal.

5. The method of claim 1, wherein the modifying the second VCO output frequency using the second PLL comprises:
   determining a second error signal in accordance with the first down-scaled signal and the second down-scaled signal, the second error signal comprising at least one of a phase difference and a frequency difference; and
   modifying the second VCO output frequency in accordance with the second error signal.

6. The method of claim 1, wherein the modifying the second VCO output frequency using the second PLL comprises:
   adding a first phase delay to the first down-scaled signal to obtain a phase-delayed signal;
   determining a second error signal in accordance with the phase-delayed signal and the second down-scaled signal, the second error signal comprising at least one of a phase difference and a frequency difference; and
   modifying the second VCO output frequency in accordance with the second error signal.

7. The method of claim 6, further comprising:
   transmitting, from a first antenna coupled to the first VCO, a first signal comprised in a radiation pattern; and
   transmitting, from a second antenna coupled to the second VCO, a second signal comprised in the radiation pattern,
   wherein the radiation pattern has a beam axis that is determined in accordance with the first phase delay.

8. The method of claim 6 further comprising:
   calculating a calibration offset;
   receiving a desired phase delay; and
   subtracting the calibration offset from the desired phase delay to obtain the first phase delay.

9. A system for voltage-controlled oscillator (VCO) control comprising:
   a first VCO having a first control signal and a first VCO output signal, wherein
      the first VCO output signal has a first VCO output frequency, and
      the first VCO is configured to modify the first VCO output frequency when the first control signal is modified;
   a second VCO having a second control signal and a second VCO output signal, wherein
      the second VCO output signal has a second VCO output frequency, and
      the second VCO is configured to modify the second VCO output frequency when the second control signal is modified;
   a second control circuit coupled to the second VCO, wherein the second control circuit is configured to modify the second control signal in accordance with a first down-scaled signal, wherein the second control circuit further comprises a second frequency down-scaling circuit coupled to the second VCO, the second frequency down-scaling circuit comprises at least one of a frequency mixer and a frequency divider and is configured to determine a second down-scaled signal in accordance with the second VCO output signal, and the second down-scaled signal has a second down-scaled frequency that is reduced by a fixed ratio relative to a current value of the second VCO output frequency; and
   a first control circuit coupled to the first VCO and to the second control circuit, wherein
      the first control circuit comprises a first frequency down-scaling circuit and a first phase lock loop (PLL) circuit,
      the first down-scaled signal has a first down-scaled frequency that is reduced by a fixed ratio relative to a current value of the first VCO output frequency,
      the first control circuit is configured to transmit the first down-scaled signal to the second control circuit over a length of printed circuit board (PCB), and
      the first PLL circuit is configured to modify the first control signal in accordance with the first down-scaled signal.

10. The system of claim 9, wherein
   the first frequency down-scaling circuit comprises at least one of a frequency mixer and a frequency divider and is configured to determine the first down-scaled signal in accordance with the first VCO output signal,
   the first control circuit further comprises an electronic oscillator configured to provide an oscillating reference signal;
   the first PLL circuit comprises:

a first PLL detector coupled to the first frequency down-scaling circuit and the electronic oscillator; and a first tuning circuit coupled to the first PLL detector and the first VCO, wherein the first tuning circuit is configured to modify the first control signal in accordance with a first error signal;

the first PLL detector is configured to determine a first error signal in accordance with the oscillating reference signal and the first down-scaled signal, and the first error signal comprises at least one of a phase difference and a frequency difference.

11. The system of claim 10, wherein
the first tuning circuit comprises a first loop output filter;
the first PLL detector is configured to determine the first error signal in accordance with a digital down-scaled signal; and
the first PLL circuit further comprises:
   a third frequency down-scaling circuit configured to determine a third down-scaled signal having a frequency that is reduced by a fixed ratio relative to a current value of the first down-scaled frequency;
   a band-pass filter configured to determine a band-pass filtered signal in accordance with the third down-scaled signal; and
   a first analog-to-digital converter (ADC) configured to digitally sample the band-pass filtered signal in accordance with the oscillating reference signal to obtain the digital down-scaled signal.

12. The system of claim 11, wherein
the first control circuit further comprises a PLL modulator configured to determine a modulated error signal in accordance with the first error signal; and
the first loop output filter is configured to modify the first control signal in accordance with the modulated error signal.

13. The system of claim 12, wherein
the PLL modulator comprises an offset value generator; and
the modulated error signal comprises a tuning signal for a frequency-modulated continuous wave.

14. The system of claim 9, wherein the second control circuit further comprises a second PLL circuit, the second PLL circuit comprising:
   a second loop output filter coupled to a second PLL detector and the second VCO, the second loop output filter being configured to modify the second control signal in accordance with a second error signal; and
   the second PLL detector coupled to the first frequency down-scaling circuit and the second frequency down-scaling circuit, wherein
   the second PLL detector is configured to determine the second error signal in accordance with the second down-scaled signal and at least one of:
      the first down-scaled signal; and
      a phase-delayed signal determined in accordance with the first down-scaled signal and a first phase delay; and
   the second error signal comprises at least one of a phase difference and a frequency difference.

15. The system of claim 14, further comprising:
   a first antenna coupled to the first VCO and configured to transmit a first signal comprised in a radiation pattern; and
   a second antenna coupled to the second VCO and configured to transmit a second signal comprised in the radiation pattern,
   wherein the second PLL detector is configured to determine the second error signal in accordance with the phase-delayed signal, and
   wherein the radiation pattern has a beam axis that is determined in accordance with the first phase delay.

16. The system of claim 15, wherein the second control circuit further comprises:
   a delay circuit coupled to the first frequency down-scaling circuit and the second PLL circuit and configured to add the first phase delay to the first down-scaled signal to obtain the phase-delayed signal.

17. The system of claim 16, wherein
the second control circuit further comprises a modem configured to receive the first phase delay; and
the first phase delay comprises a difference between a desired phase delay and a calibration offset.

18. A phased array beamforming system comprising:
   a master satellite comprising a radio frequency (RF) front end configured to transmit or receive an RF signal, and a master voltage-controlled oscillator (VCO) operatively coupled to the RF front end;
   at least one slave satellite that comprises an RF front end, the at least one slave satellite comprising a slave VCO;
   a master phase lock loop (PLL) circuit coupled to the master satellite and configured to control an output frequency of the master VCO; and
   a respective slave PLL circuit coupled to the at least one slave satellite and configured to control an output frequency of the slave VCO in accordance with a phase-delayed master VCO reference signal.

19. The system of claim 18, further comprising:
   a first frequency divider coupled to the master satellite and configured to determine a first master VCO reference signal having a down-scaled frequency that is reduced by a fixed ratio relative to a current value of the master VCO output frequency; and
   a respective delay circuit coupled to the first frequency divider and the respective slave PLL,
      wherein the respective delay circuit is configured to determine the phase-delayed master VCO reference signal in accordance with the first master VCO reference signal.

20. The system of claim 18, disposed on an FR-4 printed circuit board.

21. The system of claim 19, wherein the first frequency divider is configured to transmit the first master VCO reference signal over a length of a printed circuit board (PCB).

22. The system of claim 18, further comprising a second frequency divider coupled to the slave VCO, the second frequency divider is configured to determine a slave VCO reference signal in accordance with an output signal of the slave VCO, and the slave VCO reference signal has a second down-scaled frequency that is reduced by a fixed ratio relative to a current value of the output frequency of the slave VCO.

23. The system of claim 18, wherein the RF front end comprises:
   a transmit amplifier having an input coupled to an output of the master VCO;
   a receive amplifier; and
   a frequency mixer having a first input coupled to the output of the master VCO, a second input coupled to an output of the receive amplifier.

24. The system of claim 18, further comprising:
a first antenna coupled to the master VCO; and
a second antenna coupled to the slave VCO, wherein the first antenna and the second antenna are configured to produce a radiation pattern having a beam axis corresponding to a phase delay of the phase-delayed master VCO reference signal.

* * * * *